United States Patent [19]
Sinsheimer

[11] Patent Number: 6,166,553
[45] Date of Patent: Dec. 26, 2000

[54] PROBER-TESTER ELECTRICAL INTERFACE FOR SEMICONDUCTOR TEST

[75] Inventor: Roger Sinsheimer, Petaluma, Calif.

[73] Assignee: Xandex, Inc., Petaluma, Calif.

[21] Appl. No.: 09/106,921

[22] Filed: Jun. 29, 1998

[51] Int. Cl.[7] .................................................. G01R 31/02
[52] U.S. Cl. ............................................ 324/754; 324/758
[58] Field of Search ................................ 324/158.1, 73.1, 324/754, 755, 758, 765, 761; 439/141, 331; 438/14, 18

[56] References Cited

U.S. PATENT DOCUMENTS

| | | | |
|---|---|---|---|
| 5,068,601 | 11/1991 | Parmenter | 439/141 |
| 5,552,701 | 9/1996 | Veteran et al. | 324/158.1 |
| 5,923,189 | 7/1999 | Botka et al. | 324/758 |

*Primary Examiner*—Vinh P. Nguyen
*Attorney, Agent, or Firm*—Beyer Weaver & Thomas, LLP

[57] ABSTRACT

An apparatus for providing an electrical connection between a load board and a probe card assembly is described. The load board has a plurality of first contacts and is for interfacing with a test head. The probe card assembly has a plurality of second contacts and is for interfacing with a device-under-test (DUT). A load board assembly is provided for incorporating the load board. The load board assembly has a plurality of guide pins and either a plurality of cam members or a plurality of cam grooves. An electrical interface is provided having a plurality of conductive elements for establishing electrical contact between the first contacts and the second contacts. The electrical interface also has a plurality of apertures for receiving the guide pins thereby aligning the conductive elements with the first contacts. A cap ring is provided having the other of the plurality of cam members and the plurality of cam grooves. The probe card assembly has a plurality of apertures for receiving the guide pins thereby aligning the second contacts with the conductive elements. Rotation of the cap ring relative to the load board assembly engages the cam members in the cam grooves thereby compressing the electrical interface between the load board and the probe card assembly and establishing the electrical connection.

28 Claims, 3 Drawing Sheets

PROBER-TESTER ELECTRICAL INTERFACE FOR SEMICONDUCTOR TEST

BACKGROUND OF THE INVENTION

The present invention relates to apparatus used for the test of semiconductor devices. Specifically, the present invention relates to apparatus which facilitate the creation of a temporary electrical connection with semiconductor devices for the purpose of testing the functionality of the semiconductor devices. More specifically, the present invention provides methods and apparatus for establishing the physical and electrical relationship between a test computer's test head and a probe card for the purpose of testing the functionality of semiconductor devices while they are in the form of wafers.

The common practice of the manufacturers of semiconductor products is to 100% test their products prior to shipping them to their customers. These tests are performed both at the wafer level ("wafer sort"), where the semiconductors are still in the form in which they were manufactured, and at the package level ("package sort"), after the wafer has been sawn up and the individual chips have been mounted into their protective carriers. To perform these tests, a temporary, non-destructive electrical connection must be formed between the semiconductor device and the testing apparatus. The device used to perform this function at the wafer sort stage is generically known as a "wafer probe card".

Individuals with ordinary skill in the art will be familiar with the various types of wafer probe cards. Such an individual would also be familiar with the conventional assemblies used to interface, both mechanically and electrically, the semiconductor test computer's "test head" with an automated wafer prober in which a wafer probe card is positioned. The purpose of a test head is to place the high speed "test electronics" needed to test certain types of electronic devices as close as possible to the device-under-test (DUT). This shorter path greatly facilitates the passing of signals between the test electronics and the DUT.

The physical relationship between the test head and the wafer prober has, historically, been problematic. The electrical connection between the test head and the wafer prober is generally a rigid member and a number of inventions have been created with the goal of forcing the test head and prober into an idealized physical relationship as described in U.S. Pat. No. 4,589,815 (Smith), the entire specification of which is incorporated herein by reference for all purposes. Unfortunately, these rigid systems are generally either unwieldy or unsuccessful in their goal of forcing the test head and the prober into alignment. The result of this is a lack of reliable electrical contact between the test head and the probe card. Another undesirable result of this technique is warping of probe cards due to the forces induced on them either directly by the test head or by the Prober-Tester Interface (PTI).

As shown in FIG. 1, a typical Prober-Tester Interface System 100 consists of the following. An interface ring assembly 102 mounts into a top plate 104 of a wafer prober (not shown). Top plate 104 is commonly referred to as a "ring carrier" or "head plate". Interface ring assembly 102 receives a probe card assembly 108 and provides alignment features for both probe card assembly 108 and PTI 110, it may also include a clamping mechanism 111 for PTI 110. PTI 110 is a rigid assembly of isolated electrically conductive paths which translates the pattern of contact pads on probe card assembly 108 to a "load board" 112. Load board 112 fans out the contact pattern of probe card 108 to the pattern of the contacts which connect to the high speed test electronics in a test head (not shown). Load board 112 also provides space for passive components ("loads") and relays which interact with and condition the signals between the test head and the device-under-test (DUT). The final component of PTI system 100 is test head docking hardware (not shown), a specific implementation of which is described in the above-referenced U.S. Patent. As will be discussed, each test head manufacturer provides its own proprietary hardware for coupling the load board to the test head.

A technique called "direct docking" proposed by Motorola suggests that the test head should be simultaneously aligned and docked to the prober using a kinematic coupling alignment system. This concept would replace the conventional test head docking hardware. In general terms, such an approach suggests that the PTI would somehow capture the probe card and hold it in place against the bottom of the test head. This removes the need for a "ring carrier" or "head plate". The test head would remain in place on top of the wafer prober at all times, only to be undocked when it needed to be serviced. Such an approach would be highly advantageous, in that it would allow for the test head to be repeatably and accurately aligned to the wafer prober, something that other test head docking systems have tried with inconsistent levels of success.

It is therefore desirable to provide methods and apparatus by which direct docking as discussed above may be made a practical reality at a reasonable cost.

SUMMARY OF THE INVENTION

According to the present invention, methods and apparatus are provided which allow a wafer probe card to be aligned directly to and become an extension of a test head, rather than being aligned relative to a wafer prober. The end result is repeatable electrical contact between the tester and the probe card, along with highly repeatable positioning of the probe card needles. The present invention successfully implements "direct docking" by providing the hardware required to align the probe card to the PTI, the PTI to the load board, and the load board to the test head, all in one package. The assembly described herein is sufficiently compact that it can (with some minor redesign of the existing probe card changers built into many wafer probers today) be unlatched and swapped out from underneath a test head without first undocking the test head. This functionality is fundamental to implementing direct docking.

A load board assembly is provided which is mounted on any of a variety of OEM load board assemblies (i.e., load board with stiffener). A PTI (e.g., a pogo stack or tower) is then aligned with the load board using alignment pins extending from the load board assembly and alignment apertures in the PTI. A probe card assembly (i.e., a probe card for interfacing with the DUT and a probe card stiffener) is then aligned with the PTI using the same alignment pins on the load board assembly and alignment apertures in the probe card assembly. Finally a cap ring is provided which fits over the aligned assemblies and which has cam members which engage cam grooves in the load board assembly. When the cap ring is rotated relative to the aligned assemblies, the cam members are engaged in the cam grooves thereby sufficiently compressing the aligned assemblies such that proper electrical contact is maintained between the probe card and the load board via the PTI.

This compressed PTI system is sufficiently compact to be easily loaded into and unloaded from a wafer prober while the test head remains docked to the prober. Existing probe card loaders may be modified to effect the loading and unloading of the PTI system. In the prober, the PTI system is aligned with and coupled to the docked test head using conventional test head/load board interface hardware as dictated by the particular test head design. Thus, the present invention provides the means by which the desirable concept of "direct docking" becomes a practical reality.

According to various embodiments, the positions of the cam members and cam grooves are switched between their respective assemblies, other mechanisms are employed to compress the aligned assemblies, and the alignment pins may be on any one of the load board assembly, the PTI, or the probe card assembly with the alignment apertures being on the other two assemblies.

Thus, the present invention provides an apparatus for providing an electrical connection between a load board and a probe card assembly. The load board has a plurality of first contacts and interfaces with a test head. The probe card assembly has a plurality of second contacts and interfaces with a device-under-test (DUT). A load board assembly is provided for incorporating the load board. The load board assembly has either a plurality of guide pins, a first plurality of apertures for receiving the guide pins, or a second plurality of apertures for receiving the guide pins. An electrical interface is also provided having a plurality of conductive elements for establishing electrical contact between the first contacts and the second contacts. The electrical interface has another of the plurality of guide pins, the first plurality of apertures, and the second plurality of apertures for facilitating alignment of the conductive elements with the first contacts. A compression assembly is also provided. The probe card assembly has the remaining one of the plurality of guide pins, the first plurality of apertures, and the second plurality of apertures for facilitating alignment of the second contacts with the conductive elements. According to the invention, actuation of the compression assembly when the guide pins are engaged in the first and second pluralities of apertures compresses the electrical interface between the load board and the probe card assembly thereby establishing the electrical connection.

According to a specific embodiment, the load board assembly comprises one of a plurality of cam members and a plurality of cam grooves and the compression assembly comprises the other of the plurality of cam members and the plurality of cam grooves. According to this embodiment, rotation of the compression assembly relative to the load board assembly engages the cam members in the cam grooves thereby compressing the electrical interface between the load board and the probe card assembly and establishing the electrical connection.

The present invention also provides a method for removing a load board assembly and a probe card assembly from a prober while a test head is docked with the prober. According to the invention, an apparatus is disengaged from the test head without undocking the test head from the prober. The apparatus comprises the load board assembly, an electrical interface, the probe card assembly, and a compression assembly. Actuation of the compression assembly compresses the electrical interface between the load board assembly and the probe card assembly establishing an electrical connection therebetween. A method for loading the load board assembly and the probe card assembly into the prober while the test head is docked with the prober is also provided. According to this embodiment, the above-described apparatus is secured to the test head without undocking the test head from the prober.

A further understanding of the nature and advantages of the present invention may be realized by reference to the remaining portions of the specification and the drawings.

DESCRIPTION OF SPECIFIC EMBODIMENTS

Figure 1:
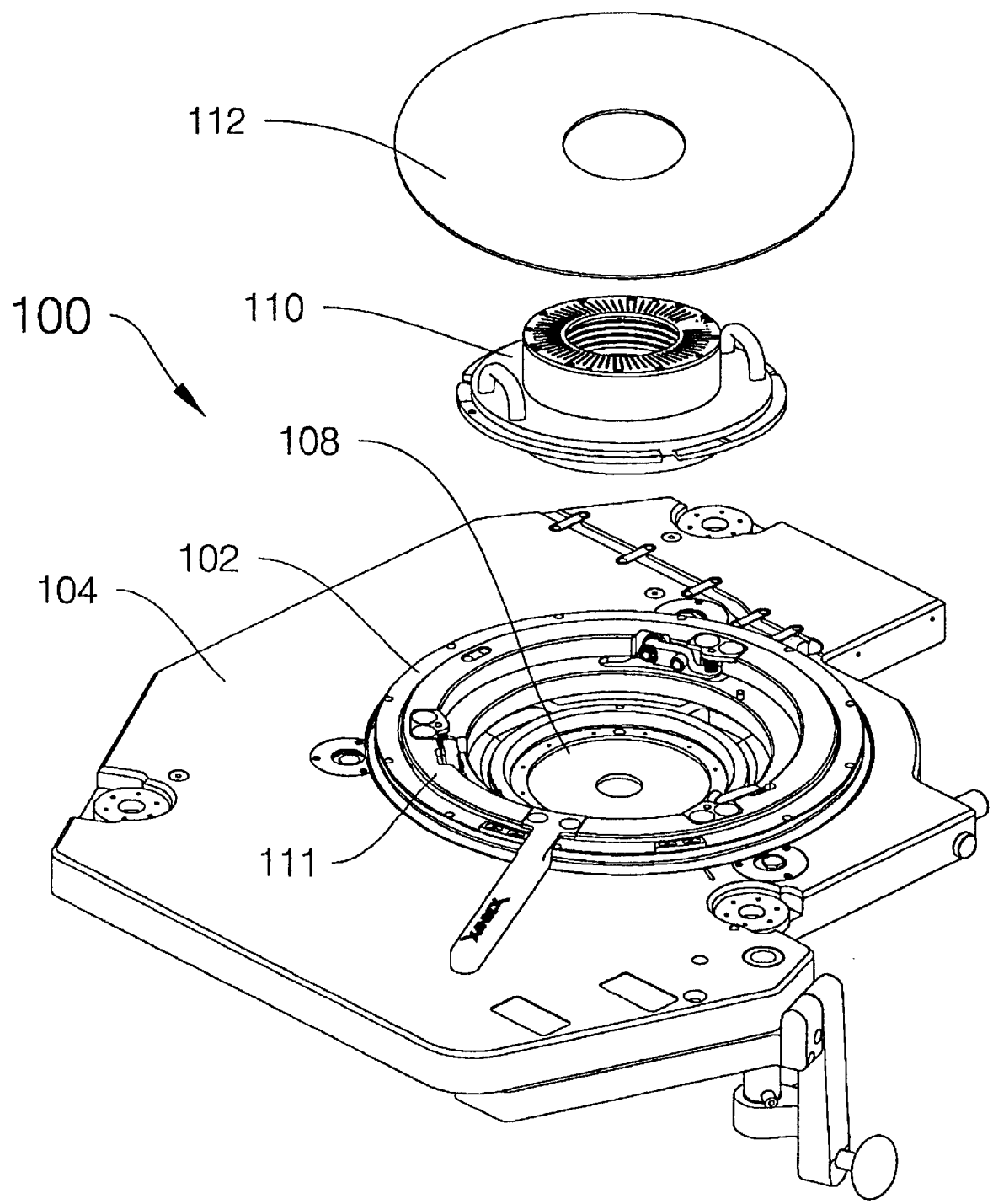
FIG. 1 is an exploded view of a conventional Prober-Tester Interface (PTI)
Figure 2A:
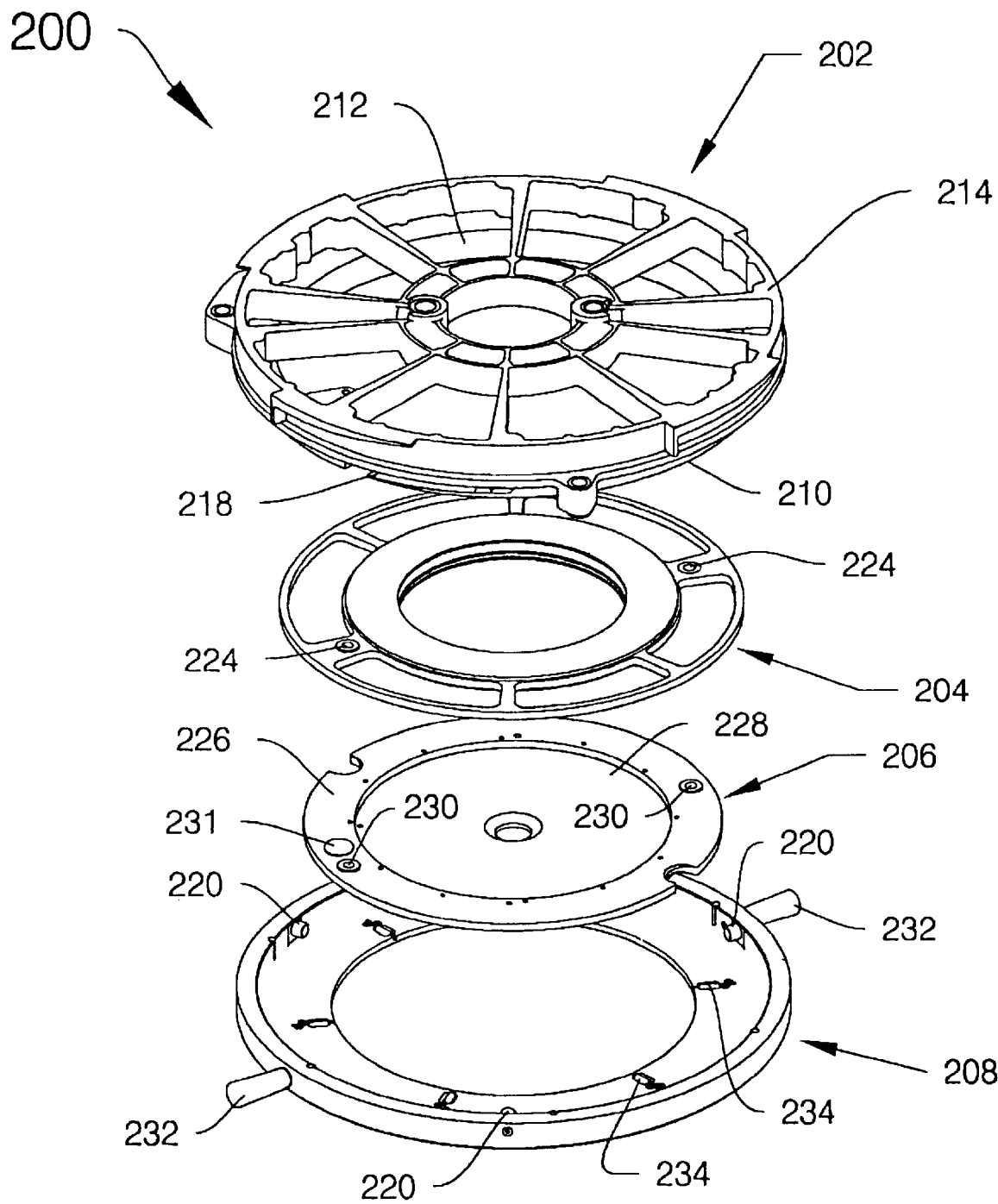
FIGS. 2a and 2b are top and bottom perspective, exploded views of a Prober-Tester Interface (PTI) System according to a specific embodiment of the invention.
Figure 2B:
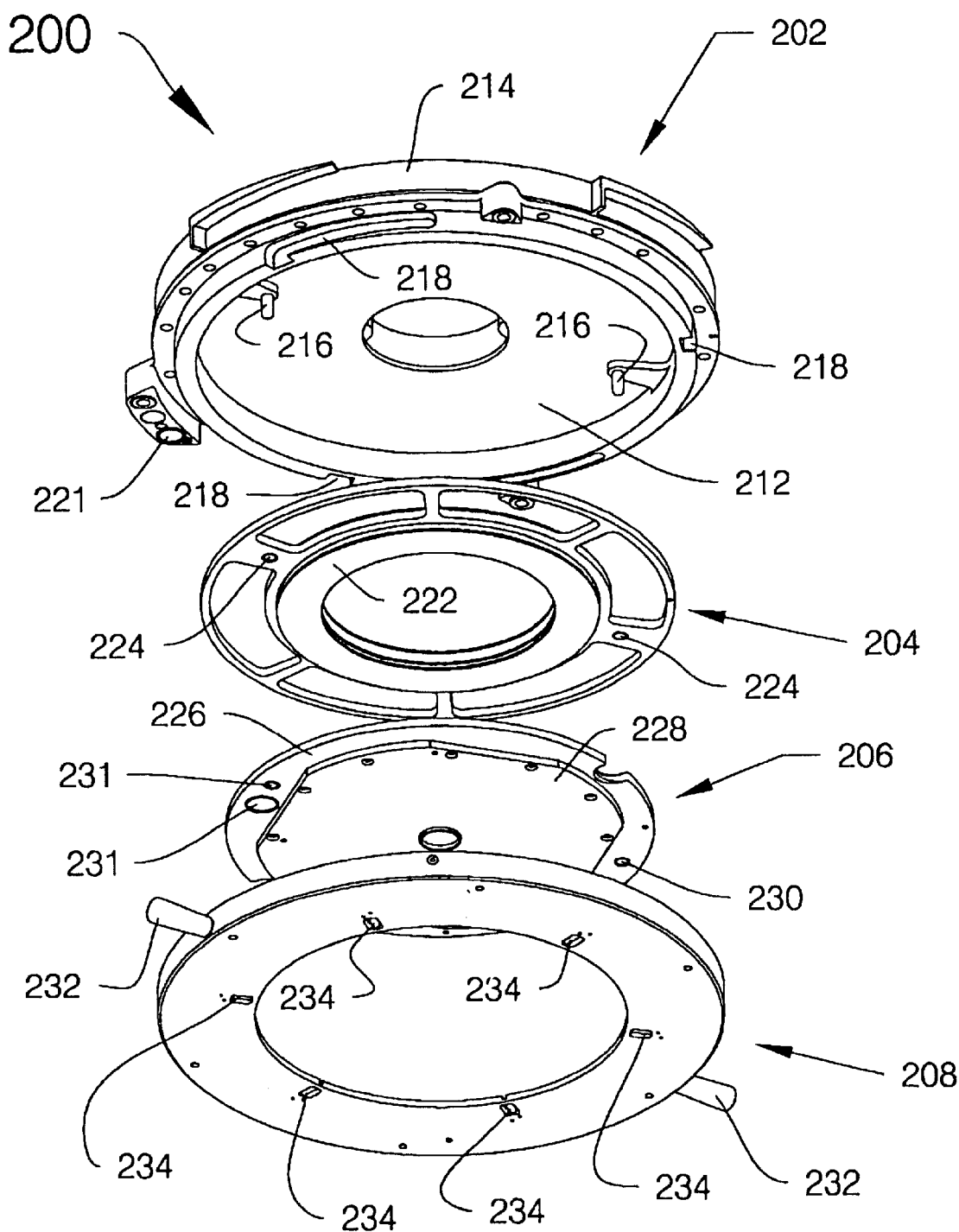

FIG. 2a is a top perspective, exploded view of a Prober-Tester Interface (PTI) System 200 according to a specific embodiment of the invention. FIG. 2b is a bottom perspective, exploded view of PTI system 200. PTI system 200 comprises load board assembly 202, PTI assembly 204, probe card assembly 206 and cap ring assembly 208. Load board assembly 202 comprises an adapter ring 210, a load board 212 having a pattern of contacts (not shown) corresponding to the test circuitry in the test head, and load board stiffener 214. Adapter ring 210 comprises at least two alignment or guide pins 216 for aligning adapter ring 210 to PTI assembly 204 and probe card assembly 206. Adapter ring 210 also includes cam grooves 218 which correspond to cam members 220 on cap ring assembly 208. As mentioned above, load board stiffener 214 is configured such that it may be secured to a test head using in a conventional manner.

Adapter ring 210 also includes a serial touch memory 221 which stores information regarding PTI system 200 including, for example, identification information specifically identifying the apparatus (e.g., serial number), operational information (e.g., a number of test cycles), and maintenance information (e.g., repair history). The information in touch memory 221 may be retrieved when system 200 is loaded into a wafer prober or some separate testing/maintenance station.

PTI assembly 204 comprising, for example, a pogo stack 222 has at least two alignment apertures 224 for receiving guide pins 216 thereby aligning the pins of the pogo stack (not shown) with the contacts on load board 212.

Probe card assembly 206 comprises a probe card stiffener 226 holding probe card 228. Probe card 228 fans out to a pattern of contacts (not shown) in a conventional manner. Alignment apertures 230 receive guide pins 216 thereby aligning the contacts of probe card 228 with the pins of the pogo stack of PTI assembly 204.

Probe card assembly 206 also includes a serial touch memory 231 which stores information regarding the probe card assembly itself including, for example, identification information specifically identifying the apparatus (e.g., serial number), operational information (e.g., a number of test cycles), and maintenance information (e.g., repair history). The information in touch memory 231 may be retrieved when a PTI system including probe card assembly 206 is loaded into a wafer prober or some separate testing/maintenance station.

As mentioned above, cam members 220 of cap ring assembly 208 correspond to cam grooves 218 of load board assembly 202. When cam members 220 are engaged in grooves 218 and cap ring assembly 208 is rotated relative to the other three aligned assemblies using handles 232, the aligned assemblies are compressed thereby ensuring a sufficient electrical and mechanical connection between load board 212 and probe card assembly 206 ( and therefore the DUT) via PTI assembly 204. Rollers 234 provide rolling contact between cap ring assembly 208 and probe card stiffener 226.

The compressed PTI system 200 is small enough such that it may be loaded into and unloaded from a conventional wafer prober with only minor modifications to currently available systems for loading and unloading probe cards. Moreover, the exchange of such PTI systems may occur while the test head remains docked to the wafer prober. That is, because alignment of the probe card assembly, electrical interface (PTI assembly) and the load board are accomplished by the apparatus described herein, conventional hardware for securing the load board assembly (and thus the entire PTI system) to the test head may be easily accomplished without going through the tedious procedure of undocking the test head each time a load board is changed. Such a result has been highly desirable in the semiconductor test industry for quite some time because of the inherent device throughput advantages.

While the invention has been particularly shown and described with reference to specific embodiments thereof, it will be understood by those skilled in the art that changes in the form and details of the disclosed embodiments may be made without departing from the spirit or scope of the invention. For example, the positions of the cam members and cam grooves may be switched between their respective assemblies without departing from the scope of the invention. Moreover, other mechanisms may be employed to compress the aligned assemblies such as, for example, a variety of clamps and vises, or threaded screw mechanism. Similarly, the alignment pins may be on any one of the load board assembly, the PTI, or the probe card assembly without departing from the scope of the invention. Therefore, the scope of the invention should be determined with reference to the appended claims.

What is claimed is:

1. An apparatus for providing an electrical connection between a load board and a probe card assembly, the load board having a plurality of first contacts, the load board being for interfacing with a test head, and the probe card assembly having a plurality of second contacts, the probe card assembly being for interfacing with a device-under-test (DUT), the apparatus comprising:

a load board assembly for incorporating the load board, the load board assembly having a plurality of guide pins and one of a plurality of cam members and a plurality of cam grooves;

an electrical interface having a plurality of conductive elements for establishing electrical contact between the first contacts and the second contacts, the electrical interface also having a plurality of apertures for receiving the guide pins thereby aligning the conductive elements with the first contacts; and a cap ring having the other of the plurality of cam members and the plurality of cam grooves;

wherein the probe card assembly has a plurality of apertures for receiving the guide pins thereby aligning the second contacts with the conductive elements, and wherein rotation of the cap ring relative to the load board assembly engages the cam members in the cam grooves thereby compressing the electrical interface between the load board and the probe card assembly and establishing the electrical connection.

2. The apparatus of claim 1 wherein the load board assembly has the cam members and the cap ring has the cam grooves.

3. The apparatus of claim 1 wherein the load board assembly has the cam grooves and the cap ring has the cam members.

4. The apparatus of claim 1 wherein the electrical interface comprises a pogo stack and the conductive elements comprises pogo pins.

5. The apparatus of claim 1 wherein the load board assembly comprises a memory for storing information regarding the apparatus.

6. The apparatus of claim 5 wherein the information comprises identification information specifically identifying the apparatus.

7. The apparatus of claim 5 wherein the information comprises operational information including a number of test cycles.

8. The apparatus of claim 5 wherein the information comprises maintenance information including a repair history.

9. The apparatus of claim 1 wherein the probe card assembly comprises a memory for storing information regarding the probe card assembly.

10. The apparatus of claim 9 wherein the information comprises identification information specifically identifying the apparatus.

11. The apparatus of claim 9 wherein the information comprises operational information including a number of test cycles.

12. The apparatus of claim 9 wherein the information comprises maintenance information including a repair history.

13. The apparatus of claim 1 wherein the load board assembly comprises an adapter ring, the guide pins extending from the adapter ring and the one of the plurality of cam members and the plurality of cam grooves being part of the adapter ring.

14. An apparatus for providing an electrical connection between a load board and a probe card assembly, the load board having a plurality of first contacts, the load board being for interfacing with a test head, and the probe card assembly having a plurality of second contacts, the probe card assembly being for interfacing with a device-under-test (DUT), the apparatus comprising:

a load board assembly for incorporating the load board, the load board assembly having a plurality of apertures and one of a plurality of cam members and a plurality of cam grooves;

an electrical interface having a plurality of conductive elements for establishing electrical contact between the first contacts and the second contacts, the electrical interface also having a plurality of guide pins, the apertures of the load board assembly being for receiving the guide pins thereby aligning the conductive elements with the first contacts; and a cap ring having the other of the plurality of cam members and the plurality of cam grooves;

wherein the probe card assembly has a plurality of apertures for receiving the guide pins thereby aligning the second contacts with the conductive elements, and wherein rotation of the cap ring relative to the load board assembly engages the cam members in the cam grooves thereby compressing the electrical interface between the load board and the probe card assembly and establishing the electrical connection.

15. An apparatus for providing an electrical connection between a load board and a probe card assembly, the load board having a plurality of first contacts, the load board being for interfacing with a test head, and the probe card assembly having a plurality of second contacts, the probe card assembly being for interfacing with a device-under-test (DUT), the apparatus comprising:

- a load board assembly for incorporating the load board, the load board assembly having a plurality of apertures and one of a plurality of cam members and a plurality of cam grooves;
- an electrical interface having a plurality of conductive elements for establishing electrical contact between the first contacts and the second contacts, the electrical interface also having a plurality of apertures for aligning with the apertures of the load board assembly thereby aligning the conductive elements with the first contacts; and
- a cap ring having the other of the plurality of cam members and the plurality of cam grooves;
- wherein the probe card assembly has a plurality of guide pins for aligning the apertures of the load board assembly and the electrical interface thereby aligning the second contacts with the conductive elements, and wherein rotation of the cap ring relative to the load board assembly engages the cam members in the cam grooves thereby compressing the electrical interface between the load board and the probe card assembly and establishing the electrical connection.

16. An apparatus for providing an electrical connection between a load board and a probe card assembly, the load board having a plurality of first contacts, the load board being for interfacing with a test head, and the probe card assembly having a plurality of second contacts, the probe card assembly being for interfacing with a device-under-test (DUT), the apparatus comprising:

- a load board assembly for incorporating the load board, the load board assembly having one of a plurality of guide pins, a first plurality of apertures for receiving the guide pins, and a second plurality of apertures for receiving the guide pins;
- an electrical interface having a plurality of conductive elements for establishing electrical contact between the first contacts and the second contacts, the electrical interface having another of the plurality of guide pins, the first plurality of apertures, and the second plurality of apertures for facilitating alignment of the conductive elements with the first contacts; and
- a compression assembly;
- wherein the probe card assembly has the remaining one of the plurality of guide pins, the first plurality of apertures, and the second plurality of apertures for facilitating alignment of the second contacts with the conductive elements, and wherein actuation of the compression assembly when the guide pins are engaged in the first and second pluralities of apertures compresses the electrical interface between the load board and the probe card assembly thereby establishing the electrical connection; wherein the load board assembly comprises one of a plurality of cam members and a plurality of cam grooves, and the compression assembly comprises the other of the plurality of cam members and the plurality of cam grooves, wherein rotation of the compression assembly relative to the load board assembly engages the cam members in the cam grooves thereby compressing the electrical interface between the load board and the probe card assembly and establishing the electrical connection.

17. The apparatus of claim 16 wherein the load board assembly has the cam members and the compression assembly has the cam grooves.

18. The apparatus of claim 16 wherein the load board assembly has the cam grooves and the compression assembly has the cam members.

19. The apparatus of claim 16 wherein the electrical interface comprises a pogo stack and the conductive elements comprises pogo pins.

20. The apparatus of claim 16 wherein the load board assembly comprises a memory for storing information regarding the apparatus.

21. The apparatus of claim 20 wherein the information comprises identification information specifically identifying the apparatus.

22. The apparatus of claim 20 wherein the information comprises operational information including a number of test cycles.

23. The apparatus of claim 20 wherein the information comprises maintenance information including a repair history.

24. The apparatus of claim 16 wherein the probe card assembly comprises a memory for storing information regarding the probe card assembly.

25. The apparatus of claims 24 wherein the information comprises identification information specifically identifying the apparatus.

26. The apparatus of claim 24 wherein the information comprises operational information including a number of test cycles.

27. The apparatus of claims 24 wherein the information comprises maintenance information including a repair history.

28. The apparatus of claim 16 wherein the load board assembly comprises an adapter ring, the guide pins extending from the adapter ring and the one of the plurality of cam members and the plurality of cam grooves being part of the adapter ring.

* * * * *